(12) United States Patent
Ichikawa et al.

(10) Patent No.: US 7,977,569 B2
(45) Date of Patent: Jul. 12, 2011

(54) DYE SENSITIZED SOLAR CELL MODULE AND MANUFACTURING METHOD THEREOF

(75) Inventors: Sumihiro Ichikawa, Nagano (JP); Koji Takei, Nagano (JP); Noriyasu Shimizu, Nagano (JP); Yasunari Suzuki, Nagano (JP); Ryo Fukasawa, Nagano (JP); Daisuke Matono, Nagano (JP); Yuichiro Shimizu, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 227 days.

(21) Appl. No.: 11/953,457

(22) Filed: Dec. 10, 2007

(65) Prior Publication Data
US 2008/0236662 A1 Oct. 2, 2008

(30) Foreign Application Priority Data
Dec. 15, 2006 (JP) .................. 2006-338456

(51) Int. Cl.
H01L 31/0224 (2006.01)
H01L 31/05 (2006.01)
(52) U.S. Cl. ........................ 136/256; 136/244
(58) Field of Classification Search .......... 136/243–265; 429/111; 427/74, 402; 438/57–98
See application file for complete search history.

(56) References Cited

U.S. PATENT DOCUMENTS
2003/0140959 A1* 7/2003 Gaudiana et al. ............. 136/244
2005/0263180 A1* 12/2005 Montello et al. .............. 136/244
2006/0160261 A1* 7/2006 Sheats et al. ................... 438/34

FOREIGN PATENT DOCUMENTS
| JP | 8-15097 | 2/1996 |
| JP | 2664194 | 6/1997 |
| JP | 2001-185244 | 7/2001 |
| JP | 2001-185743 | 7/2001 |
| JP | 2002-93475 | 3/2002 |
| JP | 2003-86822 | 3/2003 |
| JP | 2005-174679 | 6/2005 |
| JP | 2007-173045 | 7/2007 |

OTHER PUBLICATIONS

English machine translation of Fukazawa et al. JP 2007-173045A published Jul. 5, 2007.*
English machine translation of Yamanaka et al. (JP 2001-185244) published Jul. 2001.*

* cited by examiner

Primary Examiner — Basia Ridley
Assistant Examiner — Christina Chern
(74) Attorney, Agent, or Firm — Rankin, Hill & Clark LLP

(57) ABSTRACT

A solar cell module is provided with a plurality of dye sensitized solar cells arranged on a plane and connected in series with an intercell region interposed therebetween. A first transparent substrate, a first transparent conductive film, a dye carrying oxide semiconductor layer, an electrolyte layer, a catalyst layer, a second transparent conductive film and a second transparent substrate are laminated. An insulating barrier seals cells on both sides thereof in fluid tightness and insulates them in the intercell region. An electrode connecting portion provided in a vertical central part of the insulating barrier connects an extended portion of the first transparent conductive film of one of the cells to that of a second transparent conductive film of the other cell, and the electrode connecting portion penetrates through at least one of the first transparent substrate and the second transparent substrate in the vertical direction and is thus exposed.

6 Claims, 16 Drawing Sheets

DYE SENSITIZED SOLAR CELL MODULE AND MANUFACTURING METHOD THEREOF

BACKGROUND OF THE INVENTION

1. Field of the Invention

The present invention relates to a dye sensitized solar cell module and a method of manufacturing the dye sensitized solar cell module, and more particularly to a dye sensitized solar cell module which has a high cell numerical aperture and a high photoelectric converting efficiency, and at the same time, has a structure improved to fabricate a plurality of cells on a single substrate in a batch without requiring a complicated step, and a method of manufacturing the dye sensitized solar cell module.

2. Description of the Related Art

A dye sensitized solar cell is proposed such as represented by Gretzel's patent, Japanese Patent No. 2664194 and Japanese Patent No. 2101079. As compared with a silicon solar cell, material is more inexpensive and does not require large-scaled manufacturing equipment. Therefore, such a dye sensitized solar cell is advantageous for a small-scaled power supply source at a low cost.

Practically to say, however, its output voltage is relatively low because a photoelectric converting efficiency of dye sensitized solar cell is far below the level of a silicon solar cell. For this reason, it is indispensable to connect a plurality of cells in series and obtain a module for the fit of a practical use.

The greatest advantage of the dye sensitized solar cell is a low cost. In this regard, in order to obtain the module, therefore, a simple method and structure at a low cost has been simultaneously demanded.

FIGS. 1A, 1B and 2 show a typical structure of a conventional dye sensitized solar cell module.

The structure shown in FIGS. 1A and 1B have been disclosed in JP-A 2001-185743 Publication (Paragraph 0081) and JP-A 2003-86822 Publication, and individual finished dye sensitized solar cells 10 shown in FIG. 1A are connected in series through a connecting lead to obtain a module 100 as shown in FIG. 1B.

The dye sensitized solar cell 10 in FIG. 1A is constituted by laminating, from a light receiving side of an incident light L (an upper part in the drawing), in order of a transparent substrate 12, a transparent conductive film 14, a dye carrying oxide semiconductor layer 16, an electrolyte layer 18, a back conductive film 20 (transparent or opaque) and a back substrate 22 (transparent or opaque). In general, a catalyst layer 24 such as Pt or C is provided on the back conductive film 20, but this is not indispensable. The cell 10 is surrounded with a sealing material 26 in fluid tightness in order to prevent a leakage of the electrolyte 18. The transparent conductive film 14, feeding an electron (e−) that is generated from the dye carrying oxide semiconductor layer 16 to an outside, is functioning as a negative electrode of the cell 10. On the other hand, the back conductive film 20, extracting the electron (e−) from the outside, is functioning as a positive electrode of the cell 10.

FIG. 1B shows the module 100 in which three dye sensitized solar cells 10 in FIG. 1A are arranged on a plane and connected in series. The positive electrode 20 and the negative electrode 14 in the adjacent cells 10 are electrically connected to each other through an electrode connecting wire 28 and are interposed between a transparent support substrate 30 and a back support substrate 32 (transparent or opaque), and are sealed with a transparent insulating filler 34 to obtain the module 100. An output terminal of the module 100 includes a positive electrode 36 and a negative electrode 38.

In order to fabricate the module 100 in FIGS. 1A and 1B, thus, it is necessary to employ a complicated step of assembling a plurality of unit cells 10 as described above.

JP-A 2002-93475 Publication has proposed a method of fabricating a module constituted by a plurality of cells in a batch as shown in FIG. 2 without depending on the assembly of the unit cell.

A dye sensitized solar cell module 200 shown in FIG. 2 is fabricated in a batch as an integral structure in which a plurality of dye sensitized solar cells 210 and a plurality of intercell regions 215 are alternately arranged on a plane. The cell 210 has the same basic structure as that of the unit cell 10 in FIG. 1A and is constituted by laminating, from a light receiving side of an incident light L (an upper part in the drawing), in order of a transparent substrate 212, a transparent conductive film 214, a dye carrying oxide semiconductor layer 216, an electrolyte layer 218, a back conductive film 220 (transparent or opaque), and a back substrate 222 (transparent or opaque). Also in this example, a catalyst layer 224 such as Pt or C is provided on the back conductive film 220, which is, however, also not indispensable.

As shown in the drawing, the transparent substrate 212 or the back substrate 222 is each made from continuous single substrate which is common to all of the cells 210. The transparent conductive film 214 and the back conductive film 220 are constituted by electrode portions 214E and 220E provided in the cell 210 and extended portions 214T and 220T reaching an inner part of the intercell region 215 from the ends of the electrode portions, respectively.

The transparent conductive film 214, feeding an electrode (e−) generated in the dye carrying oxide semiconductor layer 216 to an outside, is functioning as a negative electrode of the cell 210. On the other hand, the back conductive film 220 for extracting the electron (e−) from the outside is functioning as a positive electrode of the cell 210.

In order to connect the cells 210 in series, the extended portion 214T of the negative electrode 214 of the cell 210 on a left side and the extended portion 220T of the positive electrode 220 of the cell 210 on a right side are electrically connected by an electrode connecting portion 228, which is individually provided in the intercell region 215. A height of the electrode connecting portion 228 defines a thickness of the electrolyte layer 218. A pair of intercell insulating barriers (or barrier walls) 226 are adhered to both sides of the electrode connecting portion 228 to carry out sealing in fluid tightness. Consequently, the electrolyte 218 is sealed in the cell 210 and a region of each cell 210 is defined.

Thus, it is possible to obtain a module by fabricating a plurality of cells on a single substrate in a serial connecting form in a batch. However, it is necessary to seal both sides of the electrode connecting portion 228 with the intercell insulating barrier 226 in fluid tightness. For this reason, the electrode connecting portion 228 shall be formed in a gap surrounded by the intercell insulating barriers 226 at both sides, by which a complicated fabricating step is required.

As already mentioned above, the dye sensitized solar cell has the greatest advantage in that a manufacturing cost can be reduced in addition to its low material cost. However, there is a problem in that the manufacturing costs of both the module structures shown in FIGS. 1A, 1B and 2 are increased due to an increase in the number of module fabricating steps and the complicated fabrication steps.

Furthermore, as for a structure in which a plurality of cells is fabricated on a single substrate in a batch in a serial connecting form, some other structures have been proposed such that an electrode connecting portion is formed by a conductive material penetrating obliquely through an intercell insulating barrier as is disclosed in JP-A 2005-174679 publication, or a structure in which both cells are connected in series with a wire interposed between electrode extended portions of adjacent cells to insulate both sides of the wire with a glass frit as is disclosed in JP-A 2001-185244 publication. However, a method of forming an insulating barrier and an electrode connecting portion between adjacent cells does not show any concrete embodiment and might not be practical in use.

As another structure in which a plurality of cells is fabricated on a single substrate in a serial connecting form in a batch, furthermore, there can be proposed a structure in which polarities of the adjacent cells are alternately reversed and arranged as shown in FIG. 3.

A dye sensitized solar cell module 300 shown in FIG. 3 is fabricated in a batch as an integral structure in which regions of a plurality of dye sensitized solar cells 310 and a plurality of intercell regions 315 are alternately reversed on a plane. The cell 310 is constituted by laminating a first transparent substrate 312, a first transparent conductive film 314, a dye carrying oxide semiconductor layer 316, an electrolyte layer 318, a catalyst layer 324, a second transparent conductive film 320, and a second transparent substrate 322.

As shown in the drawing, the first transparent substrate 312 and the second transparent substrate 322 are continuous single substrates which are common to all of the cells 310, respectively. The first transparent conductive film 314 and the second transparent conductive film 320 are constituted by electrode portions 314E and 320E provided in the cell 310 and extended portions 314T and 320T reaching an inner part of the intercell region 315 from ends of the electrode portions 314E and 320E, respectively.

In the dye sensitized solar cell module 300, polarities of adjacent cells, for example, a cell 310A and a cell 310B in the drawing are reversed as described above. More specifically, in the cell 310A, the first transparent conductive film 314, feeding an electron (e−) generated in the dye carrying oxide semiconductor layer 316 to an outside, is functioning as a negative electrode, and, at the same time, said first transparent conductive film 314 is extended to the adjacent cell 310B to be functioning as a positive electrode for extracting the electron (e−) from the outside. With the structure 300, accordingly, a separate electrode connecting portion is not required.

An insulating barrier (or barrier wall) 326 seals each cell 310 in fluid tightness. Consequently, the electrolyte 318 is sealed in the cell 310 so that a region of the individual cell 310 is defined.

Thus, it is possible to obtain a module by fabricating a plurality of cells on a single substrate in a serial connecting form in a batch. However, in every other alternate cell 310, the light to be absorbed by the dye carrying oxide semiconductor layer 316 must pass through the counter electrode 324 and the electrolyte 318. Therefore, in such an arranged cell, it is impossible to avoid a reduction in a photoelectric converting efficiency. More specifically, in the case in which the light is received at an upper surface of the dye sensitized solar cell module 300, the dye carrying oxide semiconductor layer 316 of the cell 310A absorbs a light transmitted through the first transparent substrate 312 and the first transparent conductive film 314. On the other hand, the dye carrying oxide semiconductor layer 316 of the adjacent cell 310B absorbs the light that is further transmitted through the electrolyte 318 and the catalyst layer 324 such as Pt or C. In the case in which the light is received at a lower surface of the dye sensitized solar cell module 300, the cell 310A and the cell 310B are simply reversed so that the same situation can be obtained. Thus, photoelectric converting efficiencies of the alternate cells 310, that is, half cells 310 are reduced. Therefore, it is impossible to avoid the reduction in the photoelectric converting efficiency as the whole dye sensitized solar cell module 300.

SUMMARY OF THE INVENTION

It is an object of the invention to provide a dye sensitized solar cell module which has a high cell numerical aperture and a high photoelectric converting efficiency, and at the same time, has a structure improved to fabricate a plurality of cells on a single substrate in a batch without requiring a complicated step, and a method of manufacturing the dye sensitized solar cell module.

In order to attain the object, the invention provides a dye sensitized solar cell module in which a plurality of dye sensitized solar cells is arranged on a plane basis and is connected in series with an intercell region interposed therebetween, the dye sensitized solace cell is constituted by laminating a first transparent substrate, a first transparent conductive film, a dye carrying oxide semiconductor layer, an electrolyte layer, a catalyst layer, a second transparent conductive film and a second transparent substrate, each of the first transparent substrate and the second transparent substrate is a continuous single substrate which is common to all of the dye sensitized solar cells, the first transparent conductive film is constituted by an electrode portion provided in the cell and an extended portion reaching an inner part of the intercell region from one of ends of the electrode portion, the dye carrying oxide semiconductor layer is formed on the electrode portion of the first transparent conductive film, the second transparent conductive film is constituted by an electrode portion provided in the cell and an extended portion reaching an inner part of the intercell region from one of ends of the electrode portion, and the catalyst layer is formed on the whole electrode portion and extended portion of the second transparent conductive film, wherein an insulating barrier seals the cells on both sides thereof in fluid tightness and insulates them in the intercell region, an electrode connecting portion provided in a central part in a vertical direction of the insulating barrier connects the extended portion of the first transparent conductive film of one of the cells on the both sides and that of the second transparent conductive film on the other cell, and the electrode connecting portion penetrates through at least one of the first transparent substrate and the second transparent substrate in the vertical direction and is thus exposed.

A method of manufacturing the dye sensitized solar cell module according to the invention comprises the steps of:

forming a first transparent conductive film over a first transparent substrate, forming a plurality of first parallel trenches on the first transparent conductive film and dividing the first transparent conductive film into a plurality of parts, and forming a dye carrying oxide semiconductor layer in a region other than extended portions of the individual first transparent conductive films thus divided, thereby fabricating a first board;

forming a second transparent conductive film over a second transparent substrate and forming a catalyst layer thereon, forming a plurality of second parallel trenches on a united layer of the second transparent conductive film and the catalyst layer and dividing the united layer into a plurality of parts, thereby fabricating a second board;

disposing an insulating material for a barrier in an intercell region constituted by the first trench dividing the first transparent conductive film and the extended portion of the first transparent conductive film in the first board;

superposing the second board on the first board in a state in which the second trench dividing the united layer of the second transparent conductive film and the catalyst layer is aligned with the insulating material for a barrier which is provided on the first board and they are caused to face each other in the second board, thereby filling a space between both of the boards in the intercell region with the insulating material for a barrier to form a barrier wall;

carrying out, in the intercell region, any of processes of:

forming a third trench penetrating through the barrier wall from an outer surface of the first board and reaching the second transparent conductive film of the second board;

forming a third trench penetrating through the barrier wall from an outer surface of the second board and reaching the first transparent conductive film of the first board; and forming a third trench penetrating through the barrier wall from the outer surface of one of the first board and the second board and reaching the outer surface of the other, thereby forming a pair of insulating barriers for sealing cells on both sides of the intercell region in fluid tightness and insulating them; and filling a whole inner part of the third trench with a conductive material, thereby forming an electrode connecting portion for connecting the extended portion of the first transparent conductive film and that of the second transparent conductive film.

By employing the structure of the dye sensitized solar cell module according to the invention, it is possible to fabricate a plurality of cells on a single substrate in a batch while maintaining a high cell numerical aperture and a high photoelectric converting efficiency by simple steps of forming a barrier wall, forming a trench penetrating through the barrier wall from an outer surface of one of transparent substrates to reach a transparent conductive film on the other transparent substrate or a trench reaching an outer surface of the other transparent substrate, filling the trench with a conductive material.

DESCRIPTION OF THE PREFERRED EMBODIMENTS

Embodiments of the present invention will be described hereinbelow by reference to the drawings. Unless otherwise specifically defined in the specification, terms have their ordinary meaning as would be understood by those of ordinary skill in the art.

First Embodiment

Figure 1A:
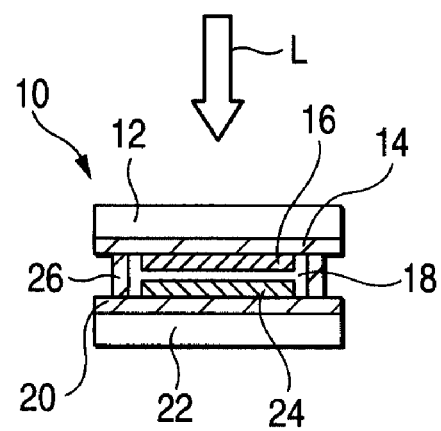
FIGS. 1A and 1B are sectional views showing (1A) an individual cell and (1B) a dye sensitized solar cell module obtained by connecting them in series and combining them according to the conventional art.
Figure 1B:
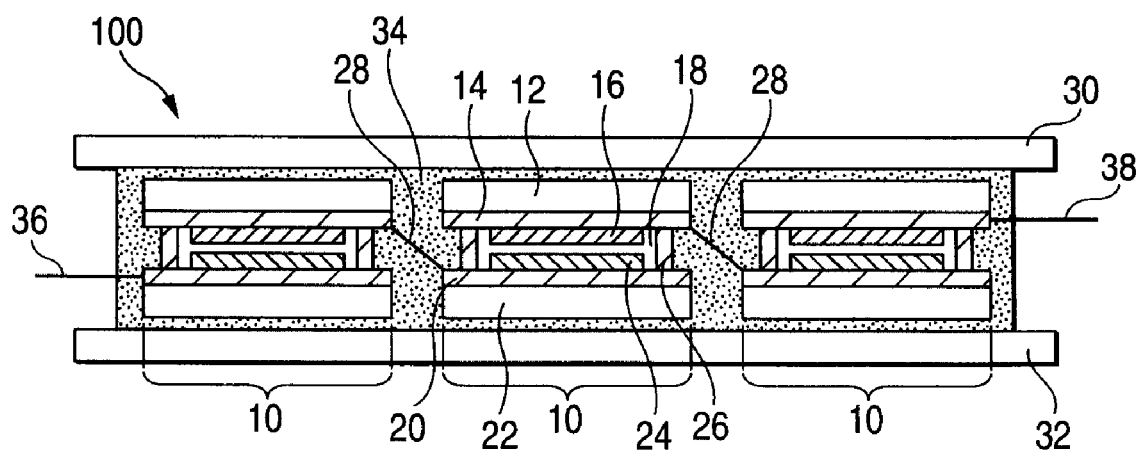
Figure 2:
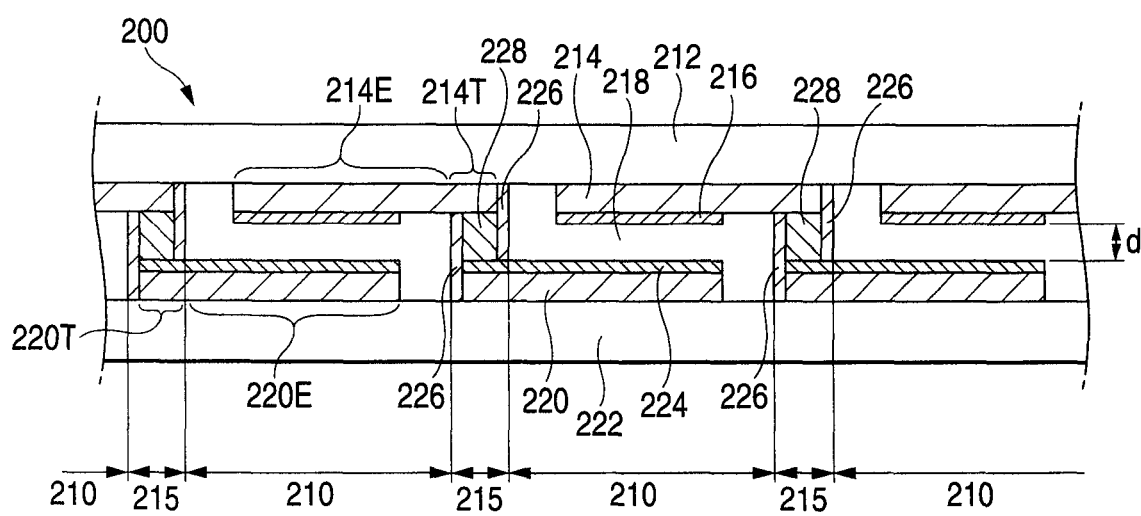
FIG. 2 is a sectional view showing a dye sensitized solar cell module in which a plurality of cells are formed on a single substrate in a batch according to the conventional art, in which it is hard to form an intercell region for connecting adjacent cells in series.
Figure 3:
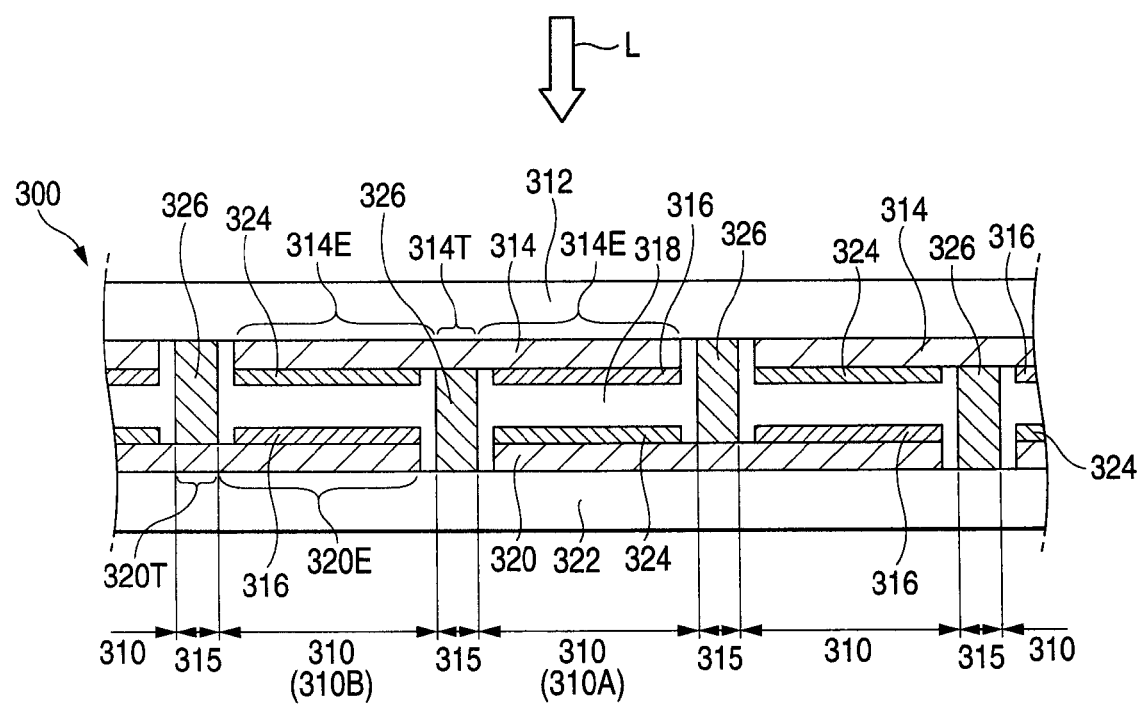
FIG. 3 is sectional views showing the dye sensitized solar cell module in which a plurality of cells are formed on a single substrate in a batch according to the conventional art, in which a polarity of the adjacent cell is inverted to easily carry out a serial connection and a photoelectric converting efficiency every cell is low.
Figure 4A:
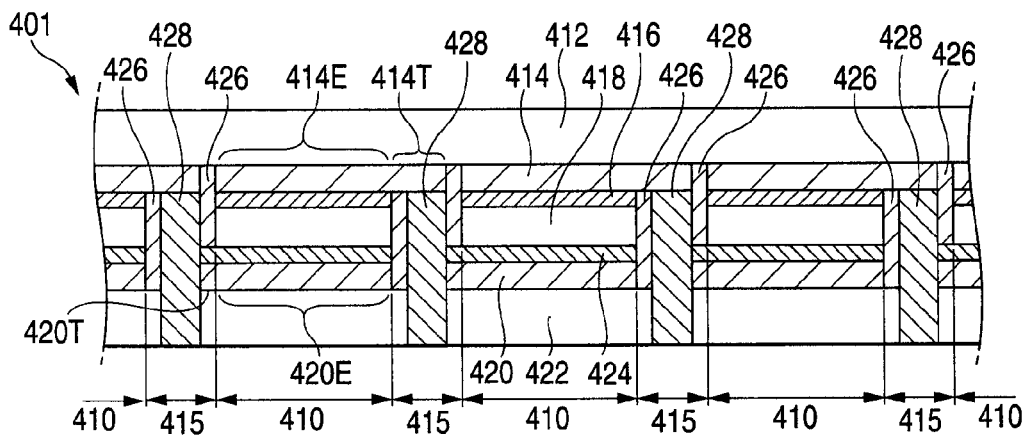
FIGS. 4A to 4C are sectional views showing a dye sensitized solar cell module in which a plurality of cells are formed on a single substrate in a batch according to an embodiment of the invention.
Figure 4B:
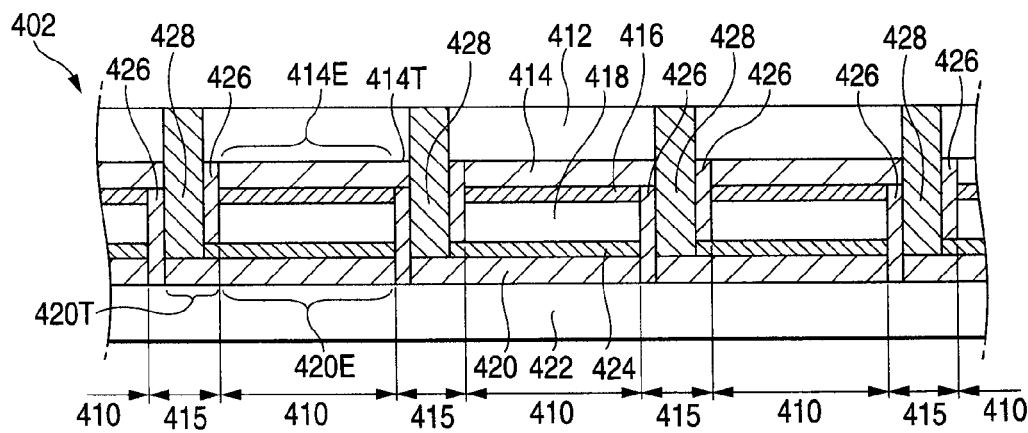
Figure 4C:
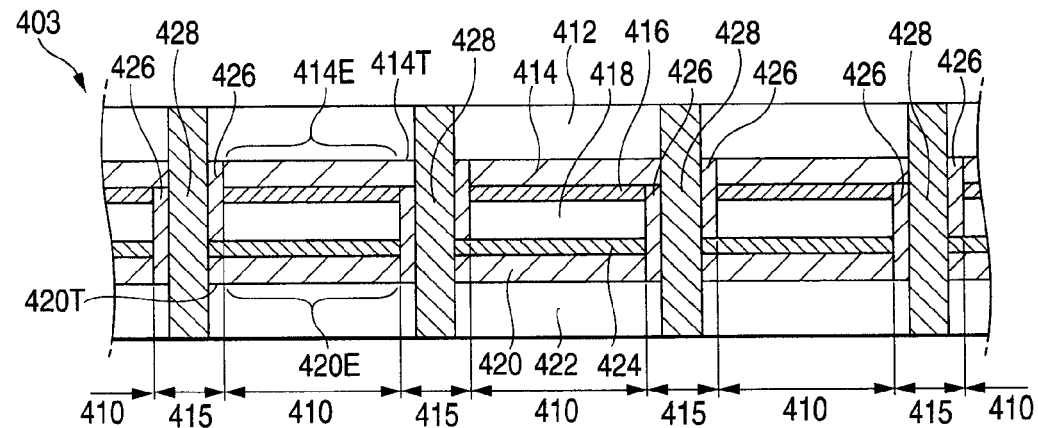

FIGS. 4A to 4C show the example of sectional structures of a dye sensitized solar cell module according to a preferred embodiment of the invention.

A dye sensitized solar cell module 401 according to the invention shown in FIG. 4A is constituted by arranging a plurality of dye sensitized solar cells 410 on a plane basis and connecting them in series with an intercell region 415 interposed therebetween.

A first transparent substrate 412, a first transparent conductive film 414, a dye carrying oxide semiconductor layer 416, an electrolyte layer 418, a catalyst layer 424, a second transparent conductive film 420 and a second transparent substrate 422 are laminated.

The first transparent substrate 412 and the second transparent substrate 422 are continuous single substrates which are common to all of the dye sensitized solar cells 410, respectively.

The first transparent conductive film 414 is constituted by an electrode portion 414E provided in the cell 410 and an extended portion 414T reaching an inner part of the intercell region 415 from one of ends of the electrode portion 414E. The dye carrying oxide semiconductor layer 416 is formed on the electrode portion 414E of the first transparent conductive film 414.

The second transparent conductive film 420 is constituted by an electrode portion 420E provided in the cell 410 and an extended portion 420T reaching an inner part of the intercell region 415 from one of ends of the electrode portion 420E. The catalyst layer 424 is formed over the whole electrode portion 420E and extended portion 420T of the second transparent conductive film 420.

The invention features that an insulating barrier 426 seals the cells 410 at both sides thereof in fluid tightness and insulates them and an electrode connecting portion 428 connects the extended portion 414T of the first transparent conductive film 414 of one of the cells 410 at both sides and the extended portion 420T of the second transparent conductive film 420 of the other cell 410 in the intercell region 415. In the case of the embodiment shown in FIG. 4A, the electrode connecting portion 428 penetrates through the second transparent substrate 422 in a vertical direction and is exposed to an outer surface of the second transparent substrate 422.

Embodiments shown in FIGS. 4B and 4C have the same structure as that of the embodiment in FIG. 4A except that the electrode connecting portion 428 penetrates through any of the first and second transparent substrates. More specifically, in the case of the embodiment shown in FIG. 4B, the electrode connecting portion 428 penetrates through the first transparent substrate 412 in the vertical direction and is exposed to the outer surface of the first transparent substrate 412. In the case of the embodiment in FIG. 4C, the electrode connecting portion 428 penetrates through both the first transparent substrate 412 and the second transparent substrate 422 in the vertical direction and is exposed to the outer surface of the first transparent substrate 412 and that of the second transparent substrate 422.

Second Embodiment

Figure 5A:
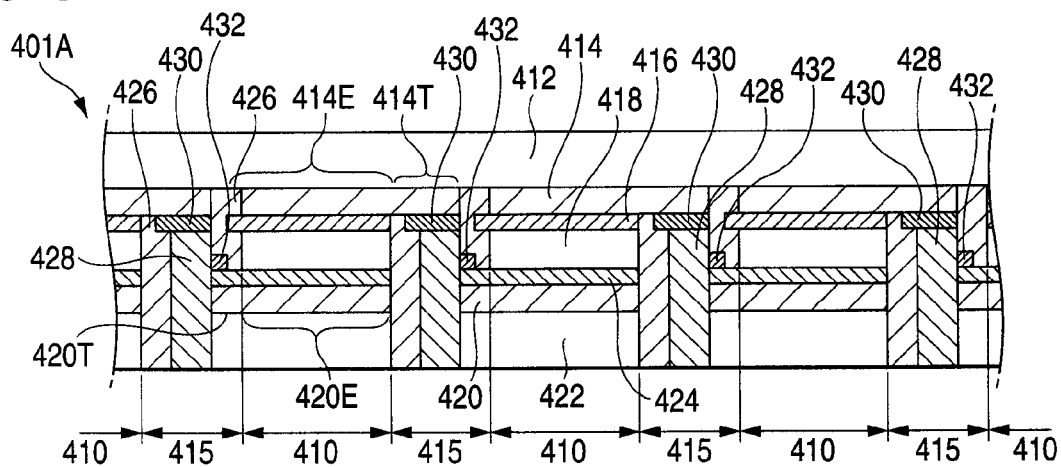
FIGS. 5A to 5C are sectional views showing a dye sensitized solar cell module in which a plurality of cells are formed on a single substrate in a batch according to another embodiment of the invention.
Figure 5B:
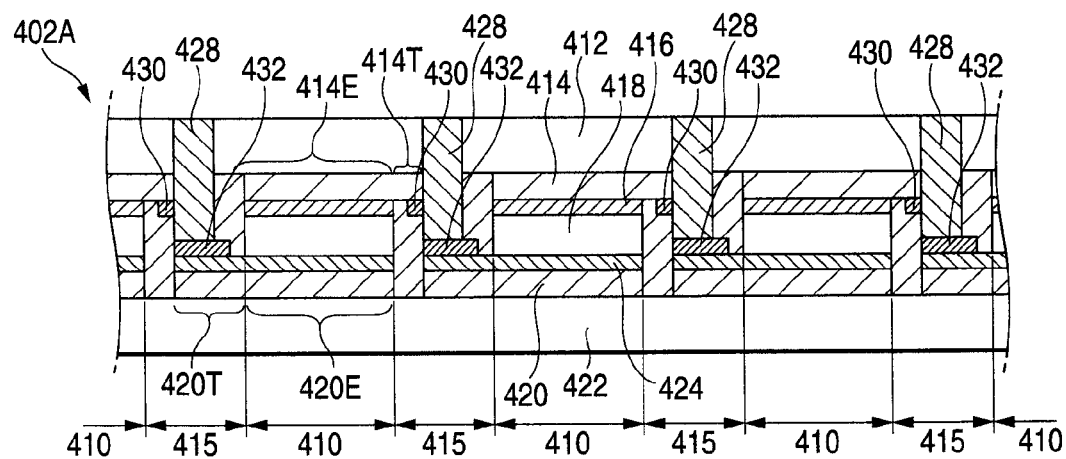
Figure 5C:
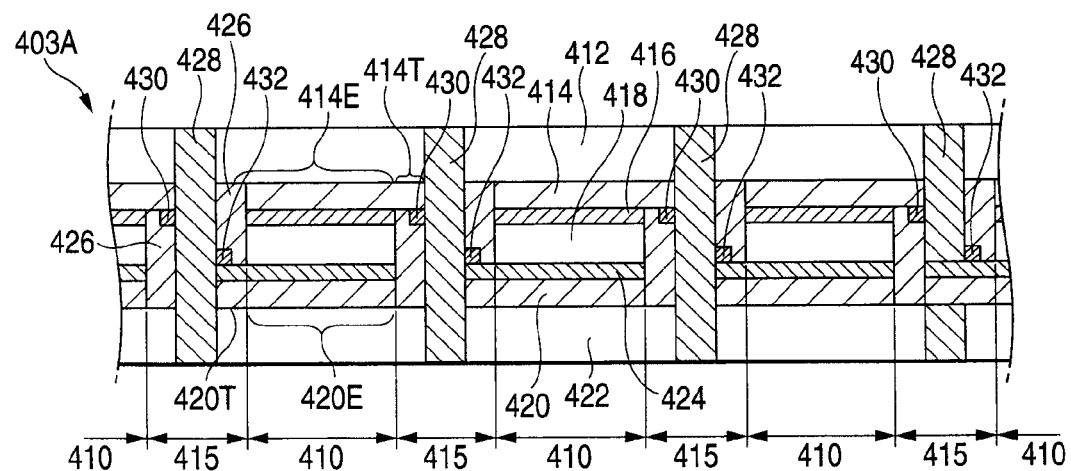

FIGS. 5A to 5C show the examples of sectional structures of a dye sensitized solar cell module according to a further preferred embodiment of the invention.

Dye sensitized solar cell modules 401A, 402A and 403A shown in FIGS. 5A, 5B and 5C have features that a first auxiliary conductive layer 430 and a second auxiliary conductive layer 432 are added to the extended portion 414T of the first transparent conductive film 414 and the extended portion 420T of the second transparent conductive film 420 which are connected to the electrode connecting portion 428 respectively in the structures of the dye sensitized solar cell modules 401, 402 and 403 shown in FIGS. 4A, 4B and 4C.

In the embodiment shown in FIG. 5A (a configuration in which an electrode connecting portion 428 penetrates through a second transparent substrate 422 on a catalyst layer 424 side and is exposed), the first auxiliary conductive layer 430 is added to compensate for a thickness of the first transparent conductive film 414 to be connected to a tip surface of the electrode connecting portion 428, thereby maintaining a conduction of the first transparent conductive film 414 and the electrode connecting portion 428 more stably. On the other hand, the second auxiliary conductive layer 432 is added to increase a sectional area of a second conductive film and the catalyst layer 424 to be connected to a side surface of the electrode connecting portion 428, thereby maintaining a conduction of the second transparent conductive film 420 and the electrode connecting portion 428 more stably.

In the embodiment shown in FIG. 5B (a configuration in which an electrode connecting portion 428 penetrates through a first transparent substrate 412 on a dye carrying oxide semiconductor layer 416 side and is exposed), a first auxiliary conductive layer 430 compensates for a thickness of a first transparent conductive film 414 to be connected to a side surface of the electrode connecting portion 428, thereby maintaining their conduction stably, and a second auxiliary conductive layer 432 compensates for a thickness of a second conductive film 420 (constituting an integral portion with a catalyst layer 424) to be connected to a tip surface of the electrode connecting portion 428, thereby maintaining their conduction stably.

In the embodiment shown in FIG. 5C (a configuration in which an electrode connecting portion 428 penetrates through both a second transparent substrate 422 on a catalyst layer 424 side and a first transparent substrate 412 on a dye carrying oxide semiconductor layer 416 side and is exposed), a first auxiliary conductive layer 430 compensates for a thickness of a first transparent conductive film 414 to be connected to a side surface of the electrode connecting portion 428, thereby maintaining their conduction stably, and a second auxiliary conductive layer 432 compensates for a thickness of a second transparent conductive film 420 (constituting an integral portion with the catalyst layer 424) to be connected to a side surface of the electrode connecting portion 428, thereby maintaining their conduction stably.

EXAMPLE

A method of manufacturing the dye sensitized solar cell modules according to the first embodiment and the second embodiment will be described below with reference to specific examples.

Example 1

Example of Manufacture of Structure According to the First Embodiment

The dye sensitized solar cell module according to each of the embodiments shown in FIGS. 4A, 4B and 4C can be manufactured by the same method. A manufacturing method will be described below by setting the case of the embodiment shown in FIG. 4A to be a typical example. FIG. 6A to FIG. 12D sequentially show the manufacturing steps thereof.

<Light Receiving Side: Fabrication of First Board>

Figure 6A:
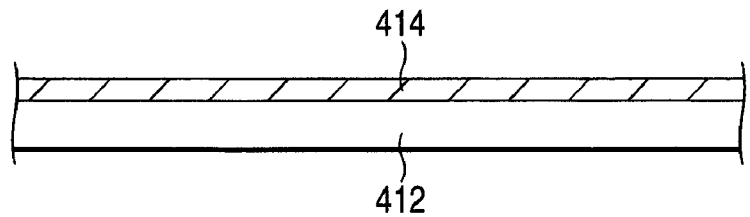
FIGS. 6A and 6C are sectional views showing a part of the sequential steps of manufacturing the dye sensitized solar cell module in FIG. 4A.

First of all, as shown in a section of FIG. 6A, a first transparent conductive film 414 is formed over a whole surface of a first transparent substrate 412. It is possible to use a product put on the market (A110U80 manufactured by Asahi Glass Company) in a state in which the FTO (fluorine-doped tin oxide) film 414 is formed on the glass substrate 412. A thickness of the first transparent conductive film 414 is equal to or greater than 0.1 μm and is usually approximately 0.3 to 2 μm.

For the first transparent conductive film 414, $SnO_2$ (tin oxide), ATO (antimony-doped tin oxide), $In_2O_3$ (indium oxide), ITO (indium-tin composite oxide), MgO (magnesium oxide) and ZnO (zinc oxide) are typical materials in addition to the FTO, and they do not need to be particularly restricted.

Figure 6B:
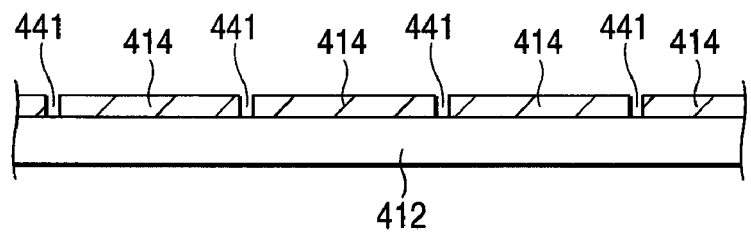

As shown in a section of FIG. 6B, next, a plurality of first trenches 441 having a width of approximately 100 to 300 nm is formed on the first transparent conductive film (FTO film) 414 in parallel with each other by a YAG laser. Consequently, the first transparent conductive film 414 is divided into a plurality of straps having a width of 10 mm×a length of 100 mm as shown in a plan view of FIG. 7, for example. FIG. 6B is a sectional view taken along a line A-A shown in FIG. 7.

Figure 6C:
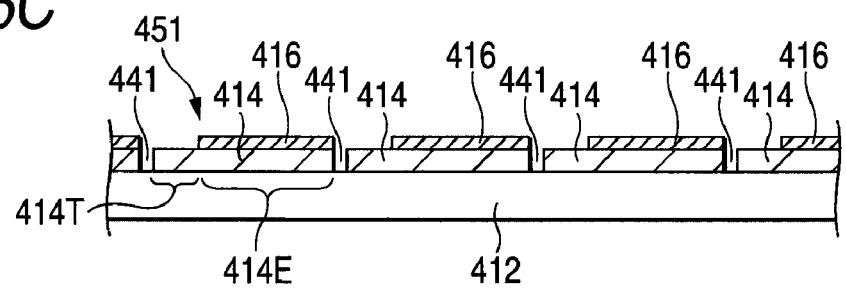
Figure 7:
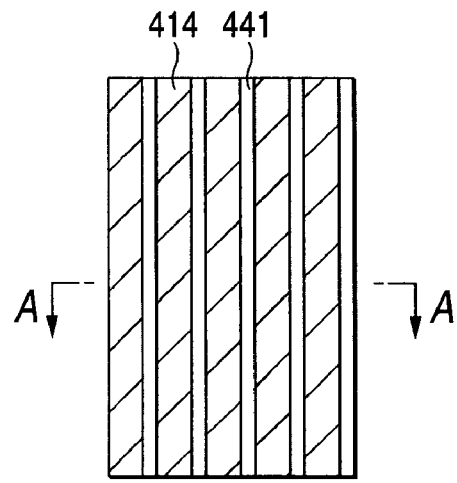
FIG. 7 is a plan view showing the step of manufacturing the dye sensitized solar cell module in FIG. 6B.
Figure 8:
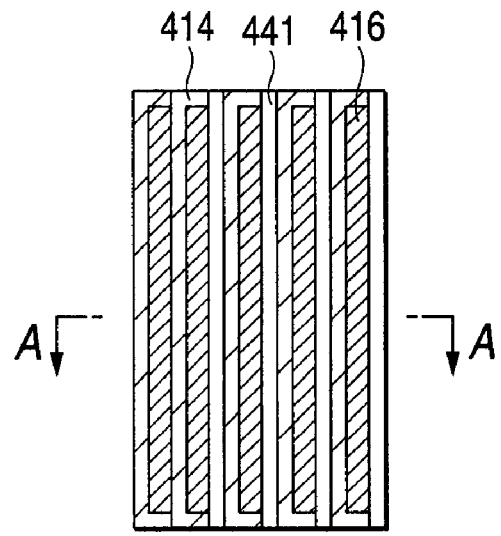
FIG. 8 is a plan view showing the step of manufacturing the dye sensitized solar cell module in FIG. 6C.

As shown in a section of FIG. 6C, subsequently, a dye carrying oxide semiconductor layer 416 is formed in a region (that is, an electrode portion 414E) other than an extended portion 414T provided on each first transparent conductive film 414 thus divided. FIG. 8 is a plan view. FIG. 6C is a sectional view taken along a line A-A shown in FIG. 8. The dye carrying oxide semiconductor layer 416 is formed in the following manner, for example.

First of all, a $TiO_2$ paste (manufactured by Catalysts & Chemicals Industries Co., Ltd.: DST-18NR) is subjected to screen printing, and is then dried and burned (450° C.×30 minutes) to form a porous $TiO_2$ semiconductor layer having a thickness of 15 μm in a width of 8 mm×a length of 95 mm (the case in which the first transparent conductive film 414 has a width of 10 mm×a length of 100 mm).

Subsequently, the porous $TiO_2$ semiconductor layer is caused to adsorb a dye so that the dye carrying oxide semiconductor layer 416 is finished. The dye adsorption is carried out in the following manner, for example.

More specifically, the first transparent substrate 412 having the porous $TiO_2$ semiconductor layer formed on the first transparent conductive film 414 is dipped in a solution of a sensitizing dye expressed in [Ru(4, 4'-dicarboxyl-2, 2'-bipyridine)$_2$-(NCS)$_2$] and is left for 24 hours at a room temperature. As a sensitizing dye solution, there is used a solution obtained by containing, in a concentration of $3 \times 10^{-4}$ mol/dm$^{-3}$, the sensitizing dye in a mixed solvent of acetonitrile and t-butanol at a volume ratio of 50:50.

For the dye carrying oxide semiconductor 416, ZnO (zinc oxide), $SnO_2$ (tin oxide), $In_2O_3$ (indium oxide), $Nb_2O_5$ (niobium oxide), $WO_3$ (tungsten oxide), $ZrO_2$ (zirconium oxide), $La_2O_3$ (lanthanum oxide), $Ta_2O_5$ (tantalum oxide), $SrTiO_3$ (strontium titanate) and $BaTiO_3$ (barium titanate) are typical materials in addition to the $TiO_2$ (titanium oxide) and these do not need to be particularly restricted.

As described above, a first board 451 on a light receiving side is obtained.

<Back Side: Fabrication of Second Board>

Figure 9A:
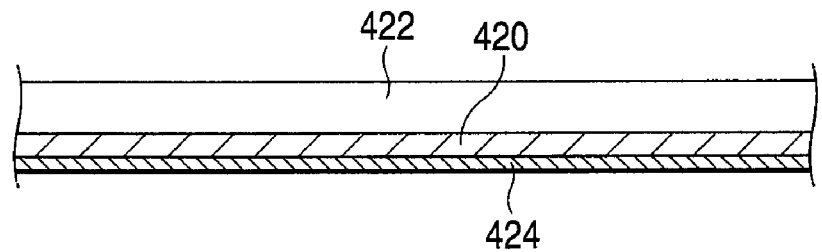
FIGS. 9A and 9B are sectional views showing another part of the sequential steps of manufacturing the dye sensitized solar cell module in FIG. 4A.

First of all, as shown in a section of FIG. 9A, a second transparent conductive film 420 and a catalyst layer 424 are sequentially formed over a whole surface of a second transparent substrate 422. This is carried out by forming, on the ITO film 420, the Pt catalyst layer 424 in a thickness of 200 to 1000 nm by sputtering using a product put on the market (manufactured by TOBI CO., LTD.: a PEN (polyethylene naphthalate) film [a film thickness of 125 μm]) in a state in which the ITO film 420 is formed on the resin film substrate 422.

For the second transparent conductive film 420, FTO, $SnO_2$ (tin oxide), ATO (antimony-doped tin oxide), $In_2O_3$ (indium oxide), MgO (magnesium oxide) and ZnO (zinc oxide) are typical materials in addition to the ITO in the same manner as the first transparent conductive film 414, and they do not need to be particularly restricted.

For the resin film substrate 422, PET (polyethylene terephthalate), polycarbonate, polypropylene, polyamide, a cycloolefin polymer, polyether sulfine and polymethyl methacrylate are taken as typical materials in addition to the PEN. In particular, materials having a high resistance to an electrolyte and an excellent light transmitting property, for example, the PET and the polycarbonate are desirable. The listed materials do not need to be restricted.

Figure 9B:
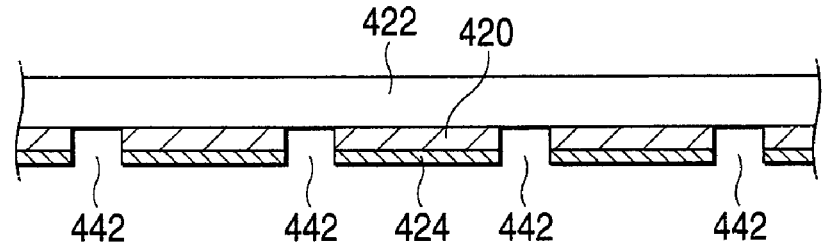
Figure 10:
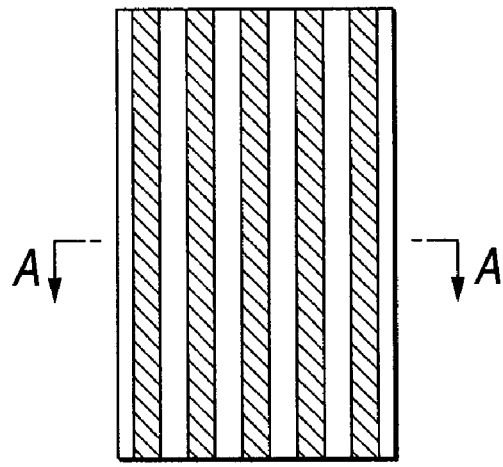
FIG. 10 is a plan view showing the step of manufacturing the dye sensitized solar cell module in FIG. 9.

As shown in a section of FIG. 9B, next, a plurality of parallel second trenches 442 is formed on a united layer [420+424] of the second transparent conductive film 420 and the catalyst layer 424 by etching using an etchant containing hydrochloric acid as a main body, and the united layer [420+424] is divided into a plurality of straps. FIG. 10 is a plan view. FIG. 9B is a sectional view taken along a line A-A shown in FIG. 10.

As described above, a second board 452 on a back side is obtained.

<Bonding of First and Second Boards>

For convenience of description, upper and lower parts shown in the drawing are reversed to the upper and lower parts of the display in FIG. 4A.

Figure 11:
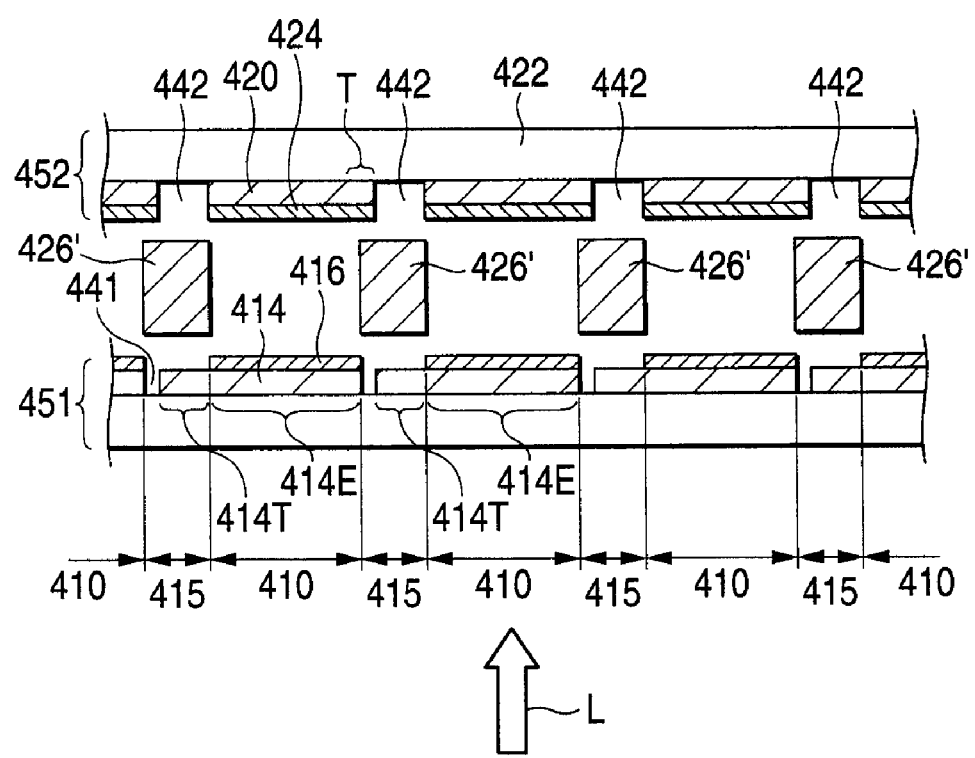
FIG. 11 is a sectional view showing one part of the sequential steps of manufacturing the dye sensitized solar cell module in FIG. 4A.

As shown in a section of FIG. 11, an insulating material 426' for a barrier is disposed in an intercell region 415 constituted by the first trench 441 dividing the first transparent conductive film 414 and the extended portion 414T of the first transparent conductive film 414 in the first board 451. In that case, it is desirable that the extended portion 414T of the first transparent conducive film 414 in a cell region 410 and an extended portion T of the united layer [420+424] of the second transparent conductive film 420 and the catalyst layer 424 in an adjacent cell region 410 should be disposed to overlap each other over a plan view. As the insulating material 426' for a barrier, a thermoplastic resin (manufactured by Du Pont Co., Ltd.: HIMILAN 1702) is used.

The second trench 442 dividing the united layer [420+424] of the second transparent conductive film 420 and the catalyst layer 424 in the second board 452 is aligned with the insulating material 426' provided above the first board 451 and are caused to face each other so that the insulating material 426' for a barrier is interposed between the first board 451 and the second board 452.

In this state, the second board 452 is superposed on the first board 451 and they are subjected to thermocompression bonding at approximately 100° C. As shown in a section of FIG. 12A, consequently, a space between both of the boards 451 and 452 in the intercell region 415 is filled with the insulating material 426' for a barrier to form a barrier wall 426".

The barrier walls 426" are functioning as sand witching and sealing the electrolyte layers as will be explained later on.

As the insulating material 426' for a barrier, a material having a necessary property such as an insulating property, a corrosion resistance to an electrolyte 418 or a mechanical strength is suitable, and a thermosetting resin and a light-curing resin can be used in addition to the thermoplastic resin described above.

For the thermoplastic resin, an ionomer resin, an EVA resin (an Ethylene-Vinyl Acetate (ethylene-vinyl acetate) copolymer resin), a polyacetal resin, a vinyl chloride resin, an acrylic resin and a phenol resin are typical in addition to the specific examples, and they do not need to be restricted. For the thermosetting resin, an epoxy resin, a phenol resin and a diallyl phthalate resin are typical and do not need to be restricted. An ultraviolet curing epoxy resin and an ultraviolet curing acrylic resin are typical for the light-curing resin and do not need to be restricted.

<Processing of Intercell Region>

Figure 12A:
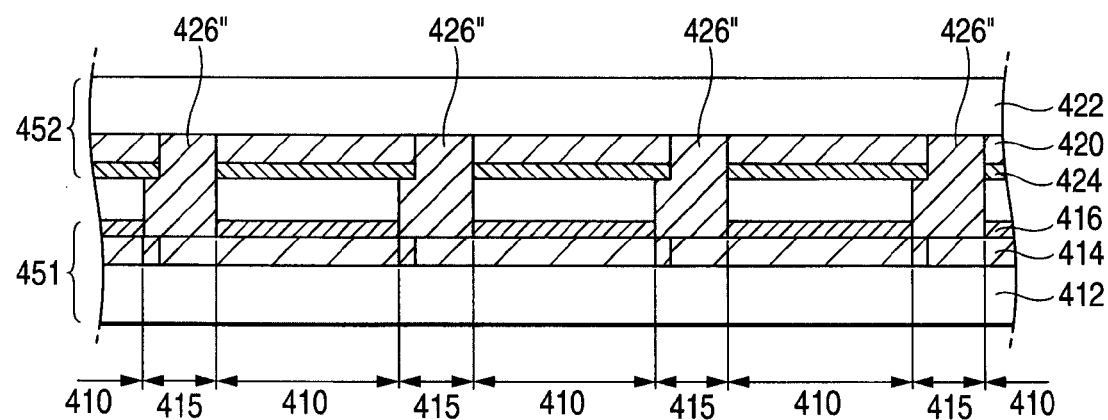
FIGS. 12A to 12D are sectional views sequentially showing subsequent steps to the steps in FIGS. 6A to 6C, 9A to 9B, and 11.
Figure 12B:
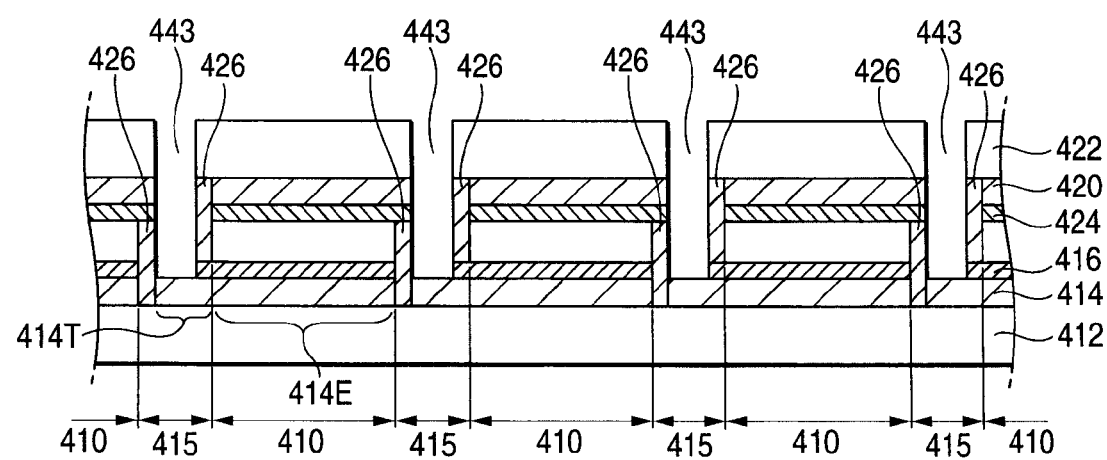

As shown in a section of FIG. 12B, a third trench 443 penetrating through the barrier wall 426" from an outer surface of the second transparent substrate (resin film substrate) 422 of the second board 452 and reaching the extended portion 414T of the first transparent conductive film (FTO) 414 of the first board 451 is formed by means of a YAG laser. The third trench 443 has a width of 50 to 500 μm and a length of 90 mm, for example. Consequently, there is formed an insulating barrier 426 for sealing the cells 410 on both sides of the intercell region 415 in fluid tightness and insulating them.

Figure 12C:
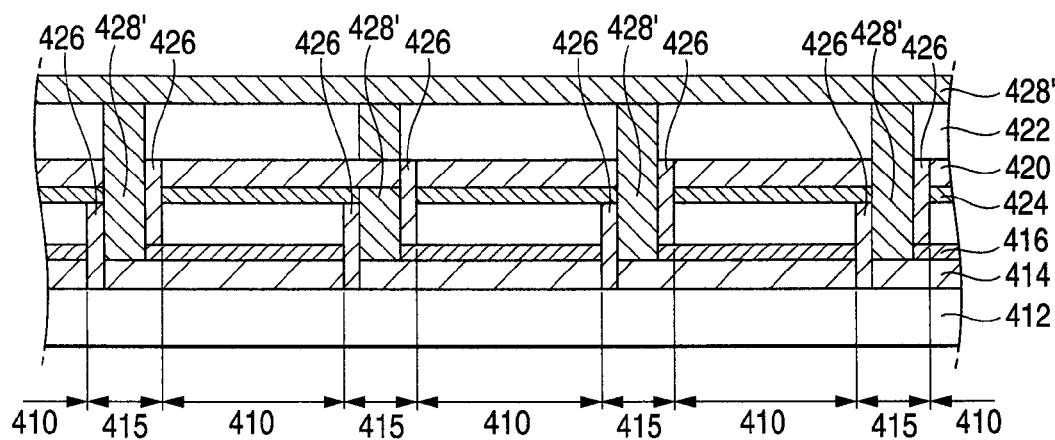

Next, electroless copper plating is carried out after non-electroless copper plating, and a whole inner part of the third trench 443 is filled with a copper 428' to be a conductive material as shown in a section of FIG. 12C. Prior to the copper plating, portions other than an outer surface of the second transparent substrate 422 and an inner surface of the third trench 443 are masked with a tape to prevent the plating.

Figure 12D:
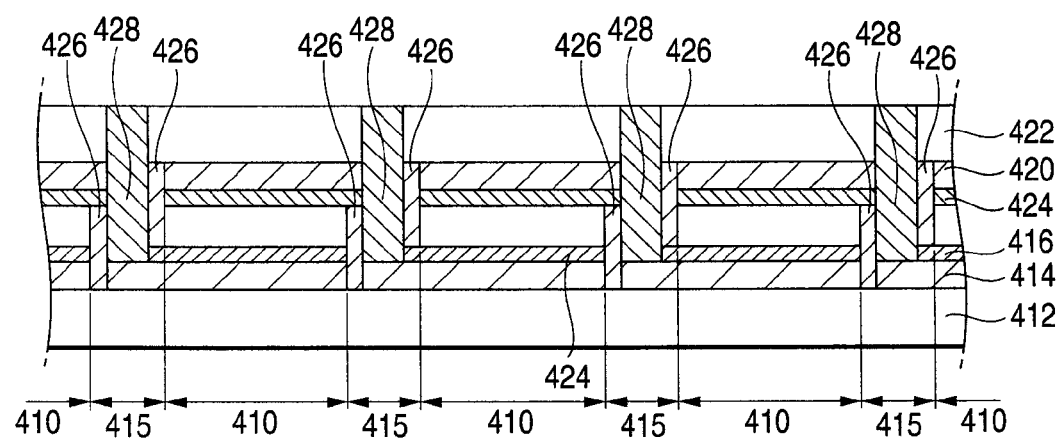

As shown in a section of FIG. 12D, subsequently, the unnecessary copper 428' formed on the outer surface of the second transparent substrate 422 is removed by chemical polishing. Consequently, an electrode connecting portion 428 is formed by the copper in the third trench 443 which is left, and an electrical connection is carried out through a path of the first transparent conductive layer 414 of the first board 451/the electrode connecting portion 428/the second transparent conductive layer 420 of the second board 452.

Finally, an electrolyte is injected from an inlet (not shown) by a pressure reduction injecting method so as to form electrolyte layers of the cell and the dye sensitized solar cell module 401 shown in FIG. 4A is finished. For the electrolyte, a 3-methoxypropionitrile solution containing 0.5 M lithium iodide, 0.05 M iodine and 0.01M 4-tert-butylpyridine is used.

Example 2

The dye sensitized solar cell module 402 shown in FIG. 4B can also be manufactured by the same manufacturing process as that in the example 1. In this case, a third trench 443 is formed on a first transparent substrate 412 comprising a dye carrying oxide semiconductor layer 416 by digging through a YAG laser. Therefore, the glass substrate used in the example 1 has a poor laser processability and is unstable for the first transparent substrate 412. Instead, a material having an excellent laser processability, for example, a resin film substrate used as a second transparent substrate 422 is utilized.

The third trench 443 is formed to penetrate through a barrier wall 426" from an outer surface of a first board 451 and to reach a second transparent conductive film 420 of a second board 452.

The other steps are the same as those in the example 1.

Example 3

A dye sensitized solar cell module 403 shown in FIG. 4C can also be manufactured by the same manufacturing process as that in the example 1. A third trench 443 is formed on both a first transparent substrate 412 and a second transparent substrate 422 by digging through a YAG laser. For the same reason as in the example 2, therefore, a material having an excellent laser processability, for example, the same resin film substrate as the second transparent substrate 422 is also used for the first transparent substrate 412.

The third trench 443 penetrating through a barrier wall 426" from an outer surface of one of a first board 451 and a second board 452 and reaching an outer surface of the other is formed.

The other steps are the same as those in the example 1.

Example 4

Example of Manufacture of Structure According to Second Embodiment

The dye sensitized solar cell modules 401A, 402A and 403A according to the respective embodiments in FIGS. 5A, 5B and 5C can be manufactured by the same methods as those for the dye sensitized solar cell modules 401, 402 and 403 according to the examples 1, 2 and 3, respectively. A manufacturing method will be described below by setting the dye sensitized solar cell module 401A in FIG. 5A to be a typical example. FIGS. 13A to 17E sequentially show a manufacturing process. An operation for forming the auxiliary conductive layers 430 and 432 is simply added to the manufacturing method described in the example 1.

<Light Receiving Side: Fabrication of First Board>

Figure 13A:
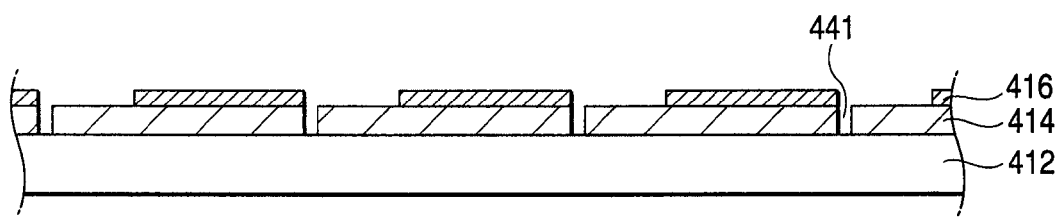
FIGS. 13A and 13B are sectional views showing a part of the sequential steps of manufacturing the dye sensitized solar cell module in FIG. 5A.

First of all, a processing is carried out to bring the states shown in FIGS. 6C and 8 according to the example 1 as shown in a section of FIG. 13A.

Figure 13B:
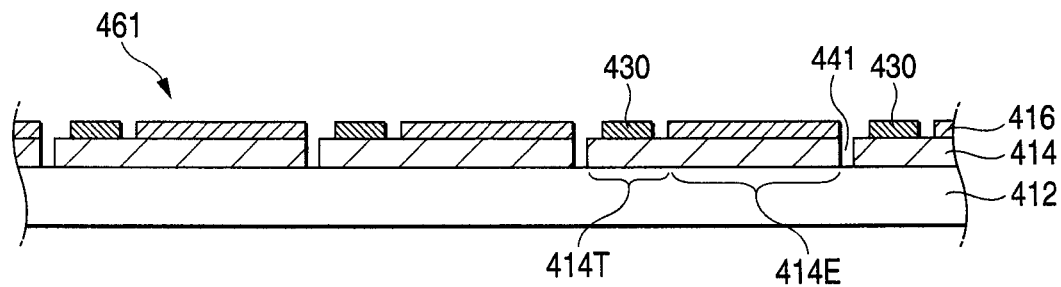
Figure 14:
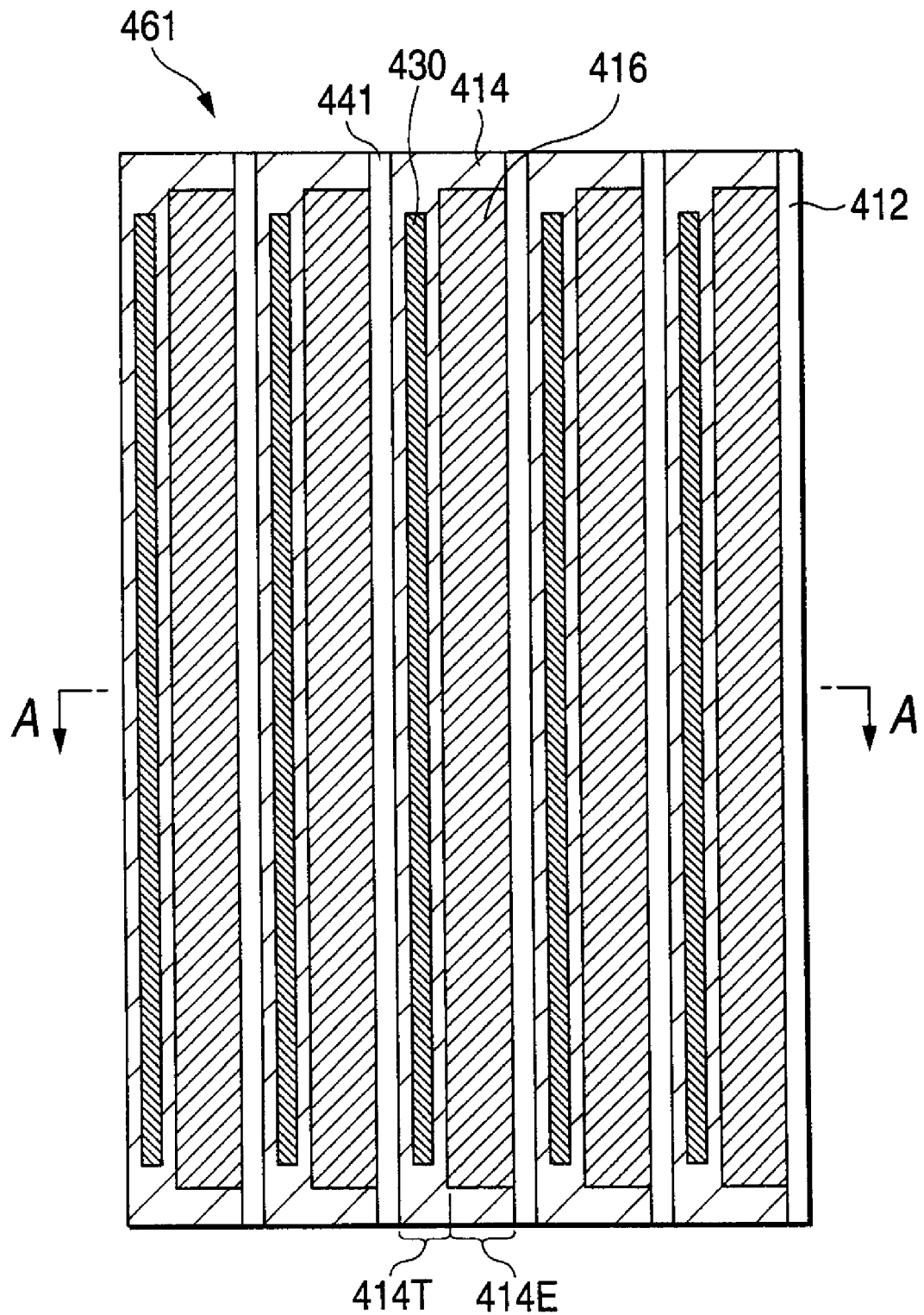
FIG. 14 is a plan view showing the step of manufacturing the dye sensitized solar cell module in FIG. 13B.

As shown in a sectional view and a plan view of FIGS. 13B and 14 (FIG. 13B is a sectional view taken along a line A-A in FIG. 14), next, an auxiliary conductive layer 430 is formed on an extended portion 414T of a first transparent conductive film 414. This is carried out by screen printing for an Ag paste and drying, for example. In accordance with a dimension of each portion according to the example 1, the auxiliary conductive layer 430 is set to have a width of 0.5 mm×a length of 95 mm and a film thickness of 4 μm or more. The width and the length of the auxiliary conductive layer 430 are set within such a range as not to deteriorate the fluid-tight sealing and insulating functions of the insulating barrier 426 (FIG. 5A).

As described above, a first board 461 on a light receiving side is obtained.

<Back Side: Fabrication of Second Board>

Figure 15A:
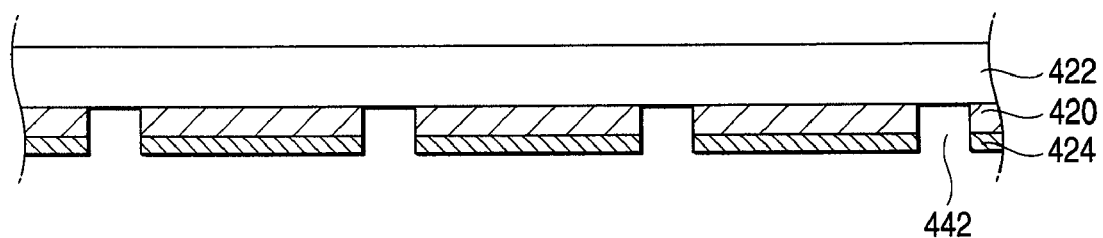
FIGS. 15A and 15B are sectional views showing subsequent steps to the steps in FIGS. 13A to 13B.

First of all, a processing is carried out to bring the states shown in FIG. 9B and FIG. 10 according to the example 1 as shown in a section of FIG. 15A.

Figure 15B:
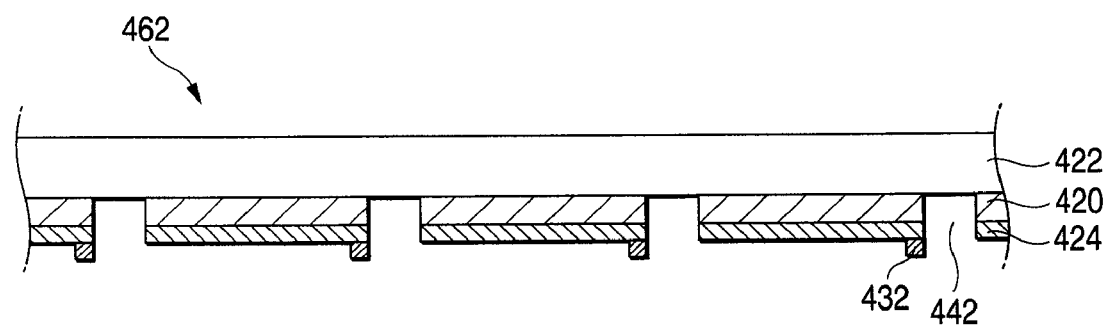
Figure 16:
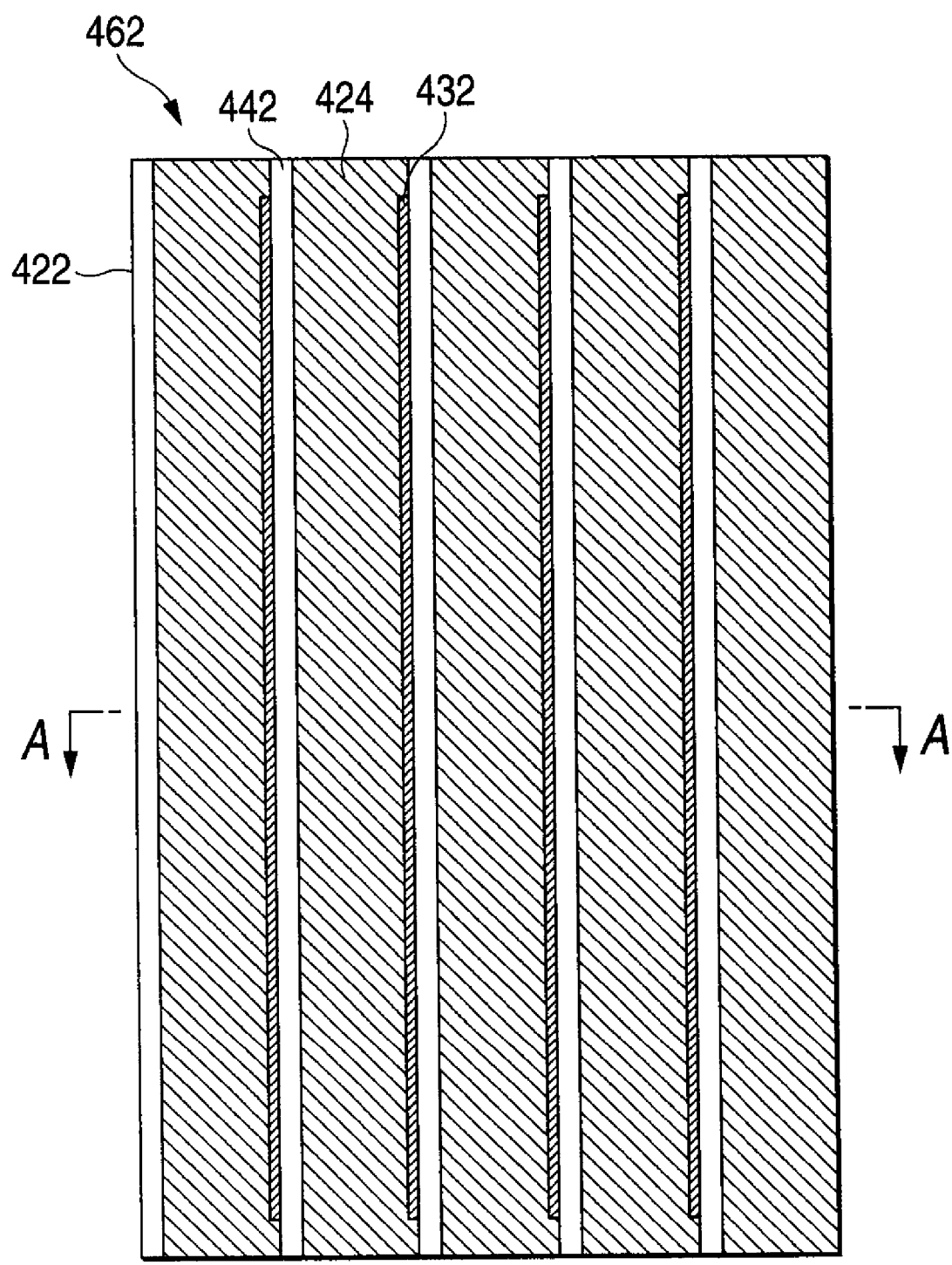
FIG. 16 is a plan view showing the step of manufacturing the dye sensitized solar cell module in FIG. 15B, and FIGS. 17A to 17E are sectional views showing subsequent steps to the steps in FIGS. 15A to 15B.

As shown in a sectional view and a plan view of FIGS. 9(2A) and (2B) (FIG. 15B is a sectional view taken along a line A-A in FIG. 16), next, an auxiliary conductive layer 432 is formed on a side edge of a second transparent conductive film 420+a catalyst layer 424 which finally acts as an extended portion 420T. This is carried out by screen printing for an Ag paste and drying, for example. In accordance with a dimension of each portion according to the example 1, the auxiliary conductive layer 430 is set to have a width of 0.5 mm×a length of 95 mm and a film thickness of 4 μm or more. The width and the length of the auxiliary conductive layer 430 are set within such a range as not to deteriorate the fluid-tight sealing and insulating functions of the insulating barrier 426 (FIG. 5A).

As described above, a second board 462 on a back side is obtained.

<Bonding of First and Second Boards>

For convenience of description, upper and lower parts shown in the drawing are reversed to the upper and lower parts of the display in FIGS. 5A to 5C.

Figure 17A:
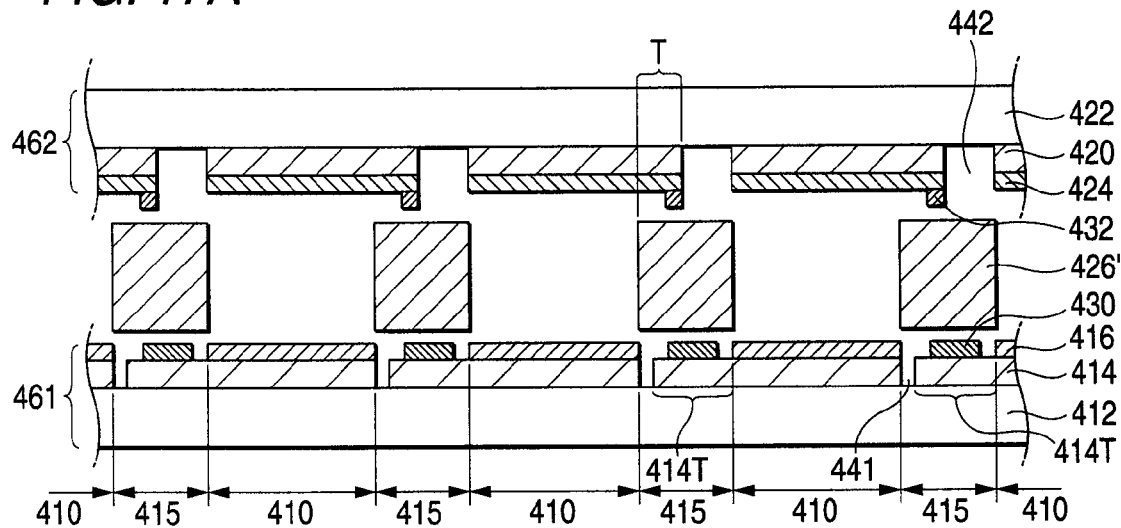
Figure 17B:
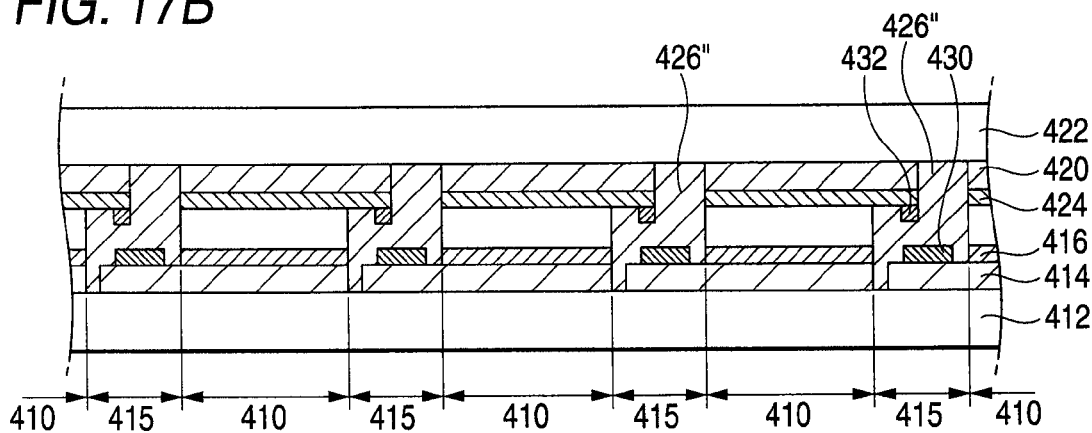

As shown in a section of FIG. 17A, an insulating material 426' for a barrier is disposed in an intercell region 415 constituted by a first trench 441 dividing a first transparent conductive film 414 and an extended portion 414T of the first transparent conductive film 414 in the first board 461. In that case, it is desirable that the extended portion 414T of the first transparent conductive film 414 in a cell region 410 and an extended portion T of a united layer [420+424] of the second transparent conductive film 420 and the catalyst layer 424 in an adjacent cell region 410 should be disposed to overlap each other over a plan view. As the insulating material 426' for a barrier, a thermoplastic resin (manufactured by Du Pont Co., Ltd.: HIMILAN 1702) is used. As the insulating material 426' for a barrier, it is also possible to use a thermosetting resin and a light-curing resin in addition to a thermoplastic resin.

A second trench 442 dividing the united layer [420+424] of the second transparent conductive film 420 and the catalyst layer 424 in the second board 462 is aligned with the insulating material 426' for a barrier which is provided above the first board 461 and they are caused to face each other so that the insulating material 426' for a barrier is interposed between the first board 461 and the second board 462.

In this state, the second board 462 is superposed on the first board 461 and they are subjected to thermocompression bonding at approximately 100° C. As shown in a section of FIG. 17B, consequently, a space between both of the boards 461 and 462 in the intercell region 415 are filled with the insulating material 426' for a barrier to form a barrier wall 426".

<Processing of Intercell Region>

Figure 17C:
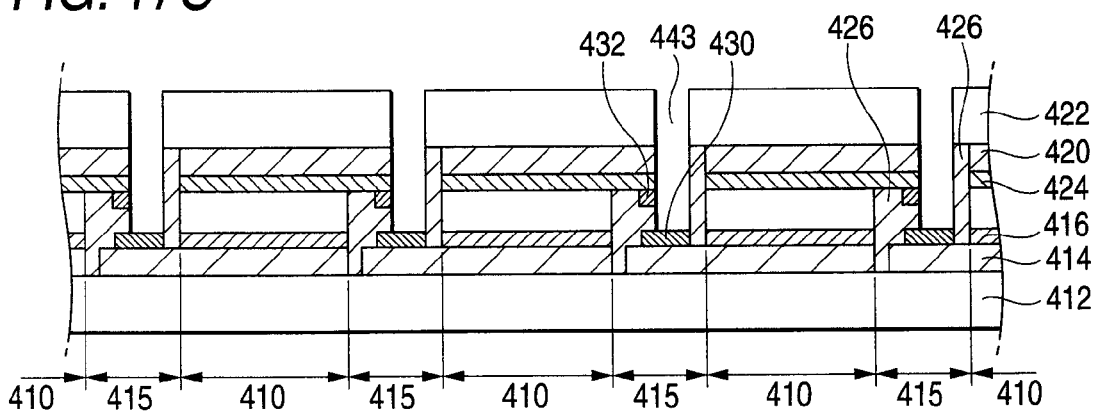

As shown in a section of FIG. 17C, a third trench 443 penetrating through the barrier wall 426" from an outer surface of a second transparent substrate (resin film substrate) 422 of the second board 462 and reaching the auxiliary conductive layer 430 provided on the extended portion 414T of the first transparent conductive film (FTO) 414 of the first board 461 is formed by means of a YAG laser. At the same time, the auxiliary conductive layer 432 of the second board 462 is exposed to a side surface of the third trench 443. The third trench 443 has a width of 50 to 500 μm and a length of 90 mm, for example. Consequently, there is formed an insulating barrier 426 for sealing the cells 410 on both sides of the intercell region 415 in fluid tightness and insulating them.

Figure 17D:
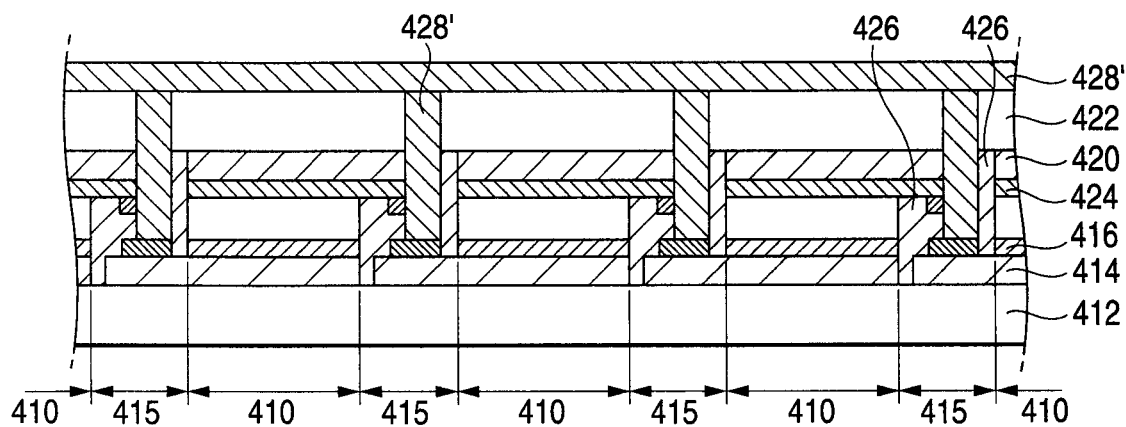

Next, electroless copper plating is carried out after non-electroless copper plating, and a whole inner part of the third trench 443 is filled with a copper 428' to be a conductor material as shown in a section of FIG. 17D. Prior to the copper plating, portions other than an outer surface of the second transparent substrate 422 and an inner surface of the third trench 443 are masked with a tape to prevent the plating.

Figure 17E:
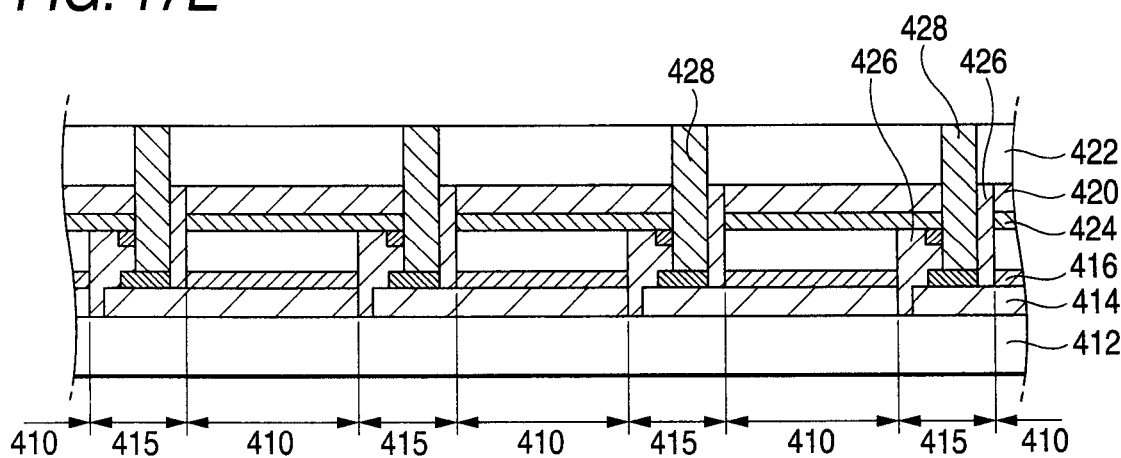

As shown in a section of FIG. 17E, subsequently, the unnecessary copper 428' formed on the outer surface of the second transparent substrate 422 is removed by chemical polishing. Consequently, an electrode connecting portion 428 is formed by the copper in the third trench 443 which is left, and an electrical connection is carried out through a path of the first transparent conductive layer 414 of the first board 461/the auxiliary conductive layer 430/the electrode connecting portion 428/[the auxiliary conductive layer 432+the second transparent conductive layer 420] of the second board 462.

Finally, the same electrolyte as that in the example 1 is injected from an inlet (not shown) by a pressure reduction injecting method so that the dye sensitized solar cell module 401A shown in FIG. 5A is finished.

It is also possible to select a material and to fabricate the dye sensitized solar cell modules 402A and 403A according to the embodiments shown in FIGS. 5B and 5C in the same respect as that in each of the examples 2 and 3 by the same procedure as described above.

In the embodiments and examples described above, the intercell region 415 is illustrated in a higher relative ratio than actual one with respect to the cell region 410 for convenience of the drawings. The actual intercell regions 415 and 515 may be considerably smaller than those in the drawings. Therefore, it is possible to maintain a very high cell numerical aperture.

According to the invention, there are provided a dye sensitized solar cell module which has a high cell numerical aperture and a high photoelectric converting efficiency, and at the same time, has a structure improved to fabricate a plurality of cells on a single substrate in a batch without requiring a complicated step, and a method of manufacturing the dye sensitized solar cell module.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

What is claimed is:

1. A dye sensitized solar cell module in which a plurality of dye sensitized solar cells are laterally arranged and connected in series with an intercell region interposed therebetween, each one of said plurality of dye sensitized solar cells comprising:
   a first common transparent substrate which is a continuous single transparent substrate and commonly used for any other one of said plurality of dye sensitized solar cells;
   a first transparent conductive film, being formed on said first transparent substrate, which is constituted by a first electrode portion provided in a cell region and a first extended portion reaching an inner part of the intercell region from one end of the first electrode portion;
   a dye carrying oxide semiconductor layer which is formed on the first electrode portion of said first transparent conductive film;
   a second common transparent substrate which is a continuous single transparent substrate and commonly used for any other one of said plurality of dye sensitized solar cells;
   a second transparent conductive film, being formed on the second common transparent substrate, which is constituted by a second electrode portion provided in the cell region and a second extended portion reaching the inner part of the intercell region from one end of the second electrode portion;
   a catalyst layer which is integrally formed on the second electrode portion and the second extended portion of said second transparent conductive film, and
   an electrolyte layer which is provided between said dye carrying oxide semiconductor layer and said catalyst layer, wherein
   an insulating barrier is provided on each side of the cell region and seals the cell region in a fluid tight manner, and wherein
   an electrode connecting portion is further provided vertically between the insulating barrier of the cell region and an insulating barrier of another cell region being adjacently provided thereto so as to electrically connect the first transparent conductive film of the cell and the second transparent conductive film of said another cell, a side surface of said electrode connecting portion directly contacting a side surface of only one of the first and second transparent conductive films, and said electrode connecting portion fully penetrates through only one of the first transparent substrate and the second transparent substrate in the vertical direction such that one end of the electrode connecting portion is externally exposed and flush with a surface of the penetrated transparent substrate, and an opposite end of the electrode connecting portion directly contacts a surface of the first or second transparent conductive film.

2. A method of manufacturing the dye sensitized solar cell module according to claim 1, comprising:
   fabricating a first board by forming a first transparent conductive film over a first transparent substrate, forming a plurality of first trenches in the first transparent conductive film so as to separate the first transparent conductive film into a plurality of individual first transparent conductive films, and forming dye carrying oxide semiconductor layers on regions other than extended portions of the respective individual first transparent conductive films;
   fabricating a second board by forming a second transparent conductive film over a second transparent substrate, forming a catalyst layer on the second transparent conductive film, and forming a plurality of second trenches into layers of the second transparent conductive film and the catalyst layer so as to separate said layers into a plurality of parts;

disposing insulating materials which function as barriers for intercell regions, each of said intercell regions being determined by any one of the first trenches and the extended portions of any one of the individual first transparent conductive films corresponding thereto;

superposing the second board onto the first board such that the second trenches are aligned with the respective insulating materials provided on the first board, by which spaces between both of the boards in the intercell regions are filled with the insulating materials to form barrier walls;

forming a third trench fully penetrating through the barrier wall from an outer surface of only one of the first and second boards, so as to expose the extended portion of the first or second transparent conductive film; and filling a whole inner part of the third trench with conductive material, thereby forming an electrode connecting portion for electrically connecting the first transparent conductive film of the cell and the second transparent conductive film of another cell.

3. The method of manufacturing a dye sensitized solar cell module according to claim 2, further comprising:

forming a first auxiliary conductive layer in the extended portion of the first transparent conductive film after the step of fabricating the first board and before the step of disposing the insulating material for a barrier; and forming a second auxiliary conductive layer in an extended portion of an united layer of the second transparent conductive film and the catalyst layer after the step of fabricating the second board and before the step of forming the barrier wall.

4. A dye sensitized solar cell module in which plural sets of dye sensitized solar cells are laterally arranged and connected in series with intercell regions interposed therebetween, comprising:

a first board including a first common transparent substrate on which a plurality of first transparent conductive films and a plurality of respective dye carrying oxide semiconductor layers are formed;

a second board including a second common transparent substrate on which a plurality of second transparent conductive films and a plurality of respective catalyst layers are formed;

a plurality of electrode connecting portions which are provided vertically so as to electrically connect one of said plurality of the first transparent conductive films and one of said plurality of the second transparent conductive films;

a plurality of electrolyte layers which are provided between said first board and said second board, and plural sets of paired insulating barriers which are vertically provided in the intercell regions such that each of said plurality of electrolyte layers is sealed by each set of paired insulating barriers, wherein each set of dye sensitized solar cells is provided in a cell region and composed of:
one of the plurality of first transparent conductive films;
one of the respective plurality of dye carrying oxide semiconductor layers;
one of the plurality of second transparent conductive films;
one of the respective plurality of catalyst layers, and
one of the plurality of electrolyte layers which is sandwiched by said one of the plurality of dye carrying oxide semiconductor layers and said one of the plurality of catalyst layers being opposed to each other and sealed by a set of paired insulating barriers, further wherein the plurality of electrode connecting portions are further provided in the intercell regions, each being disposed between one of the sets of the paired insulating barriers and one of another sets of the paired insulating barriers so as to electrically connect said one of the plurality of first transparent conductive films and one of the plurality of second transparent conductive films of another set of dye sensitized solar cell such that a side surface of each electrode connecting portion directly contacts a side surface of only one of the first and second transparent conductive films, each electrode connecting portion fully penetrating through only one of the first transparent substrate and the second transparent substrate in the vertical direction such that one end of the electrode connecting portion is externally exposed and flush with a surface of the penetrated transparent substrate, and an opposite end of the electrode connecting portion directly contacts a surface of the first or second transparent conductive film.

5. The dye sensitized solar cell module according to claim 4 wherein each of said plurality of the first transparent conductive films is constituted by a first electrode portion provided in the cell region and a first extended portion reaching one of inner parts of the intercell regions from one end of the first electrode portion, and each of said plurality of the dye carrying oxide semiconductor layers is formed on the first electrode portion thereof.

6. The dye sensitized solar cell module according to claim 4 wherein each of said plurality of the second transparent conductive films is constituted by a second electrode portion provided in the cell region and a second extended portion reaching said one of the inner parts of the intercell regions from one end of the second electrode portion, and each of said plurality of the catalyst layers is integrally formed on the second electrode portion and the second extended portion of said second transparent conductive film.

* * * * *